(12) United States Patent
Heo

(10) Patent No.: US 7,389,237 B2
(45) Date of Patent: Jun. 17, 2008

(54) RECORDING AND REPRODUCING APPARATUS FOR USE WITH OPTICAL RECORDING MEDIUM HAVING REAL-TIME, LOSSLESSLY ENCODED DATA

(75) Inventor: Jae-Hoon Heo, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 304 days.

(21) Appl. No.: 11/264,149

(22) Filed: Nov. 2, 2005

(65) Prior Publication Data

US 2006/0053019 A1 Mar. 9, 2006

Related U.S. Application Data

(60) Continuation of application No. 10/693,944, filed on Oct. 28, 2003, now Pat. No. 7,133,832, which is a continuation of application No. 10/290,278, filed on Nov. 8, 2002, now Pat. No. 6,678,662, which is a continuation of application No. 09/907,966, filed on Jul. 19, 2001, now Pat. No. 6,546,370, which is a division of application No. 09/304,264, filed on May 6, 1999, now Pat. No. 6,385,587.

(30) Foreign Application Priority Data

May 6, 1998  (KR) .................................... 98-16182

(51) Int. Cl.
*G10L 19/00* (2006.01)
*H03M 7/30* (2006.01)
(52) U.S. Cl. ........................................ 704/503; 341/67
(58) Field of Classification Search ............... 704/503; 341/67
See application file for complete search history.

(56) References Cited

U.S. PATENT DOCUMENTS 4,785,349 A  11/1988 Keith et al.

(Continued)

FOREIGN PATENT DOCUMENTS

| EP | 0 700 214 | 3/1996 |
|----|-----------|--------|
| JP | 5-250811 | 9/1993 |
| KR | 98-16182 | 5/1998 |
| WO | 92/15173 | 9/1992 |
| WO | 97/13365 | 4/1997 |

OTHER PUBLICATIONS

U.S. Appl. No. 10/693,944, filed Oct. 28, 2003, Jae-Hoon Heo, Samsung Electronics Co., Ltd.

*Primary Examiner*—Susan McFadden
(74) *Attorney, Agent, or Firm*—Stein, McEwen & Bui, LLP

(57) ABSTRACT

A lossless encoding and/or decoding apparatus which encodes audio data on a real-time basis includes a lossless compression unit which losslessly compression encodes the audio data stored in an input buffer in units of predetermined data and outputs the encoded data in sequence, and an output buffer which stores the encoded audio data output from the lossless compression unit. A bitrate controller divides a plurality of the encoded audio data stored in the output buffer into first data having a data amount exceeding the maximum bitrate and second data having a data amount less than the maximum bitrate, divides the first data into third data being the encoded audio data having a data amount of the maximum bitrate and fourth data being the encoded data of the portion exceeding the maximum bitrate, and controls the output buffer so that the fourth data is output together with the second data.

9 Claims, 2 Drawing Sheets

U.S. PATENT DOCUMENTS

| | | |
|---|---|---|
| 4,868,653 A | 9/1989 | Golin et al. |
| 4,918,523 A | 4/1990 | Simon et al. |
| 5,404,166 A | 4/1995 | Gillard et al. |
| 5,535,290 A | 7/1996 | Allen |
| 5,583,500 A | 12/1996 | Allen et al. |
| 5,604,498 A | 2/1997 | Park |
| 5,612,956 A | 3/1997 | Walker et al. |
| 5,648,948 A | 7/1997 | Itoh et al. |
| 5,717,394 A | 2/1998 | Schwartz et al. |
| 5,839,100 A | 11/1998 | Wegener |
| 5,914,680 A | 6/1999 | Murashita |
| 6,385,587 B1 | 5/2002 | Heo |
| 6,473,736 B2 | 10/2002 | Heo |
| 6,477,501 B1 | 11/2002 | Heo |
| 6,480,829 B2 | 11/2002 | Heo |
| 6,546,370 B2 | 4/2003 | Heo |
| 6,678,662 B2 | 1/2004 | Heo |
| 7,133,832 B2 * | 11/2006 | Heo ............................ 704/503 |

* cited by examiner

RECORDING AND REPRODUCING APPARATUS FOR USE WITH OPTICAL RECORDING MEDIUM HAVING REAL-TIME, LOSSLESSLY ENCODED DATA

CROSS-REFERENCE TO RELATED APPLICATIONS

This application is a continuation application of application Ser. No. 10/693,944, filed Oct. 28, 2003, now U.S. Pat. No. 7,133,832, which is a continuation application of application Ser. No. 10/290,278, filed Nov. 8, 2002, now U.S. Pat. No. 6,678,662, which is a continuation of application Ser. No. 09/907,966, filed Jul. 19, 2001, now U.S. Pat. No. 6,546,370, which is a divisional of application Ser. No. 09/304,264, filed May 6, 1999, which issued as U.S. Pat. No. 6,385,587, which claims the benefit of Korean Application No. 98-16182, filed May 6, 1998, in the Korean Patent Office, the disclosures of which are incorporated herein by reference. This application is related to U.S. patent application Ser. No. 09/588,755, which issued as U.S. Pat. No. 6,477,501, U.S. patent application Ser. No. 09/907,964, which issued as U.S. Pat. No. 6,480,829, and U.S. patent application Ser. No. 09/907,965, which issued as U.S. Pat. No. 6,473,736.

BACKGROUND OF THE INVENTION

1. Field of the Invention

The present invention relates to a lossless encoding and decoding system, and method therefor, and more particularly, to a lossless encoding and decoding system including a lossless encoding apparatus and a lossless decoding apparatus in which encoded data can be decoded on a real-time basis.

2. Description of the Related Art

In general, a digital audio signal is obtained from an analog audio signal by means of a pulse code modulation method, in order to represent audio information with the number of channels, the number of bits and a sampling frequency according to DVD-audio standards. However, since a digital audio signal includes redundancy data, it is required to use lossless compression encoding methods, in order to shorten a recording time of a digital audio signal with respect to a digital versatile disc (DVD) and improve a bitrate.

A representative example of lossless compression encoding methods is the Huffman coding method, in which input data having a higher frequency of occurrence is assigned with a relatively shorter length of codeword and input data having a lower frequency of occurrence is assigned with a relatively longer length of codeword. In the case that a digital audio signal is losslessly compressed by the Huffman coding method, it is more efficiently coded than in the case that only a linear pulse code modulation (PCM) method is used.

Meanwhile, a predictor is used in the case that input data has predictable properties. The predictor determines prediction data corresponding to new input data using previous input data, and then uses a method for compressing a difference between the prediction data and the new input data. In the case that such a predictor is additionally used in the above-described lossless compression unit, an encoding efficiency with respect to the digital audio signal can be further enhanced.

When the above-described conventional lossless encoding method is used, a bitrate of the encoded data varies according to the degree of the property and randomness of input data, although a bitrate of the input data is constant. Thus, since conventional lossless coding methods require a very large capacity of buffers, in the case of data compression and decompression, it is difficult to encode or decode data in real-time. In addition, although a buffer capacity is increased in order to solve the above problem, a delay in decoding still remains.

SUMMARY OF THE INVENTION

To solve the above problems, it is an object of the present invention to provide a lossless encoding apparatus for encoding data on a real-time basis.

It is another object of the present invention to provide a lossless decoding apparatus for decoding encoded data on a real-time basis.

It is still another object of the present invention to provide a lossless encoding and decoding system having a lossless encoding apparatus and a lossless decoding apparatus in which encoded data can be decoded on a real-time basis.

Additional objects and advantages of the invention will be set forth in part in the description which follows and, in part, will be obvious from the description, or may be learned by practice of the invention.

To accomplish the above and other objects of the present invention, there is provided a lossless encoding apparatus for encoding input audio data, comprising an input buffer to store the input audio data; a lossless compression unit to losslessly compression encode the audio data stored in the input buffer in units of predetermined data and output the encoded audio data in sequence; an output buffer to store the encoded audio data output from the lossless compression unit; and a bitrate controller to distinguish each predetermined data unit of the encoded audio data stored in the output buffer as first data having a data amount exceeding a maximum bitrate or second data having a data amount less than the maximum bitrate, dividing the first data into third data being the encoded audio data having a data amount of the maximum bitrate and fourth data being the encoded data of a portion of the first data exceeding the maximum bitrate, and control the output buffer so that the fourth data is output together with the second data from the output buffer.

To further accomplish the above and other objects of the present invention, there is provided a lossless decoding apparatus to decode input data to restore audio data, comprising an input buffer to store the input audio data and maintain an input sequence thereof; a lossless restorer to losslessly restore the input audio data output from the input buffer, to generate the restored audio data; a buffer controller to control the input buffer, so that first data having no identification information among the input audio data stored in the input buffer is supplied to the lossless restorer and second data having identification information is combined with third data having the same identification information and supplied to the lossless restorer, wherein the first data has a data amount by which a result obtained by lossless encoding of the input audio data of a predetermined data unit does not exceed a maximum bitrate, and the second data and third data form fourth data by which a result obtained by lossless encoding of the input audio data of a same predetermined data unit exceeds the maximum bitrate, and wherein the second data is encoded audio data having a data amount of the maximum bitrate among the fourth data and the third data is encoded audio data of the portion exceeding the maximum bitrate among the fourth data; and an output buffer to store and output the restored audio data generated in the lossless restorer.

To still further accomplish the above and other objects of the present invention, there is provided a lossless encoding and decoding system for encoding and decoding input audio data, comprising a lossless encoding apparatus comprising a first input buffer to store the input audio data, a lossless compression unit to losslessly compression encode the audio data stored in the first input buffer in units of predetermined data and output the encoded audio data in sequence, a first output buffer to store the encoded audio data output from the lossless compression unit, and a bitrate controller to distinguish each predetermined data unit of the encoded audio data stored in the output buffer as first data having a data amount exceeding a maximum bitrate or second data having a data amount less than the maximum bitrate, dividing the first data into third data being the encoded audio data having a data amount of the maximum bitrate and fourth data being the encoded data of a portion of the first data exceeding the maximum bitrate, add identification information to the third data and fourth data to indicate which of the third data and fourth data are from the same predetermined data units, and control the first output buffer so that the fourth data is output together with the second data from the first buffer, and the second through fourth data are output as a bitstream, and a lossless decoding apparatus comprising a second input buffer to store the bitstream in a same input sequence thereof, a lossless restorer to losslessly restore the bitstream output from the second input buffer, generate the input audio data, a buffer controller to control the second input buffer so that the second data having no identification information among the data stored in the second input buffer is supplied to the lossless restorer and the third data and fourth data having the same identification information are combined and supplied to the lossless restorer, a second output buffer to store and output the restored input audio data generated in the lossless restorer.

BRIEF DESCRIPTION OF THE DRAWINGS

The above objects and other advantages of the present invention will become more apparent by describing in detail the structures and operations of the present invention with reference to the accompanying drawings, in which.

DETAILED DESCRIPTION OF A PREFERRED EMBODIMENT

Figure 1:
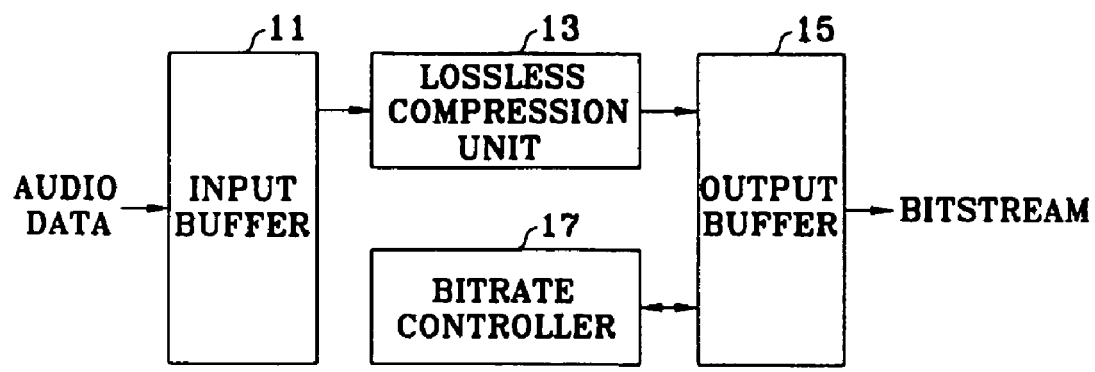
FIG. 1 is a block diagram showing a lossless encoding apparatus according to an embodiment of the present invention.

A preferred embodiment of the present invention will be described with reference to the accompanying drawings, in which elements having the same reference numerals perform the same functions.

In FIG. 1 showing a lossless encoding apparatus according to an embodiment of the present invention, an input buffer 11 stores digital audio data input from an external source and supplies the stored audio data to a lossless compression unit 13 in the same sequence as its input sequence. The lossless compression unit 13 losslessly compresses and encodes the audio data supplied from the input buffer 11 in each of predetermined data units. In this embodiment of the present invention, for example, a frame is used as a predetermined data unit. Also, the lossless compression unit 13 losslessly compresses and encodes the audio data by means of a lossless compression encoding method such as a well-known Huffman encoding method. The audio data encoded by the lossless compression unit 13 is input to an output buffer 15. The output buffer 15 stores the input encoded audio data. The output buffer 15 stores the encoded audio data in such a pattern that the encoded audio data corresponding to a random frame can be distinguished from the encoded audio data corresponding to the other frames. A bitrate controller 17 stores a maximum bitrate determined based on a bitrate resulting from losslessly encoding all of the audio data corresponding to an audio track of a recording storage medium such as a DVD. The bitrate controller 17 controls the output buffer 15 in such a manner that the encoded audio data stored in the output buffer 15 is output at an output bitrate which is equal to or less than the maximum bitrate.

Figure 2:
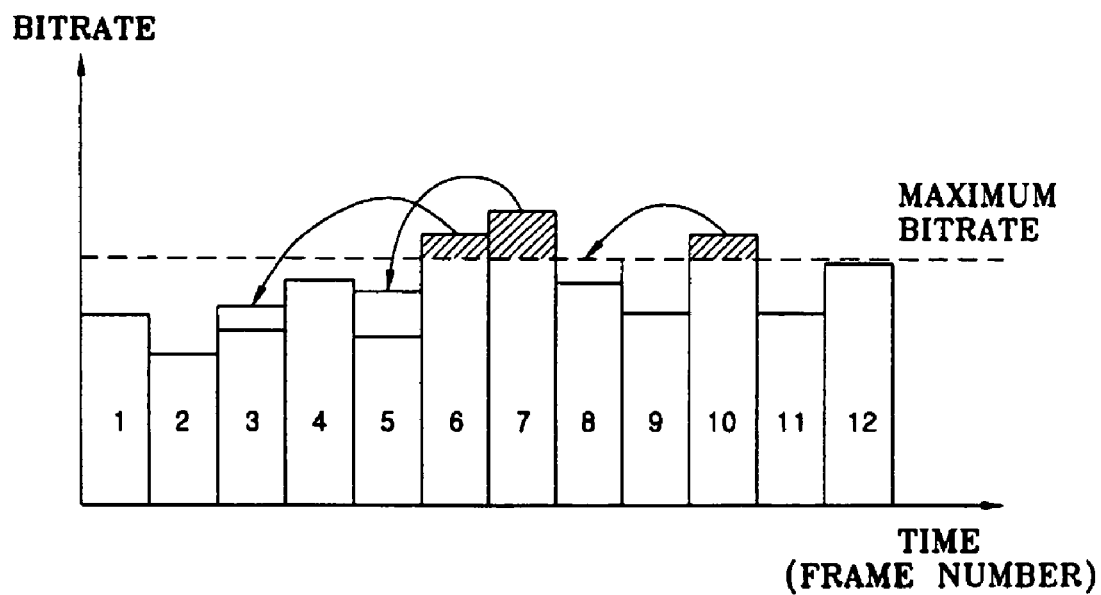
FIG. 2 is a conceptual view for explaining the operation of a bitrate controller shown in FIG. 1.

Referring to FIG. 2, the operation of the bitrate controller 17 will be described below. The bitrate controller 17 distinguishes each frame of the encoded audio data stored in the output buffer 15 into first data having a data amount exceeding the maximum bitrate or second data having a data amount not exceeding the maximum bitrate. By the above division, for example, the encoded audio data of the frames of frame numbers 6, 7 and 10 shown in FIG. 2 is defined as first data. The bitrate controller 17 divides respective first data into third data being the encoded audio data having a data amount of the maximum bitrate and fourth data being the encoded audio data of the portion exceeding the maximum bitrate. The fourth data is shown as hatched portions in FIG. 2. The bitrate controller 17 adds identification information by which the fourth data and the third data corresponding to the fourth data can be distinguished from data of the other frames, to the fourth data and the third data corresponding to the fourth data. Then, the bitrate controller 17 controls the output buffer 15 in such a manner that the fourth data is output together with the second data of the other frame from the output buffer 15. The bitrate controller 17 determines the second data to which the fourth data is added, so that the combined data does not exceed the maximum bitrate.

Figure 3:
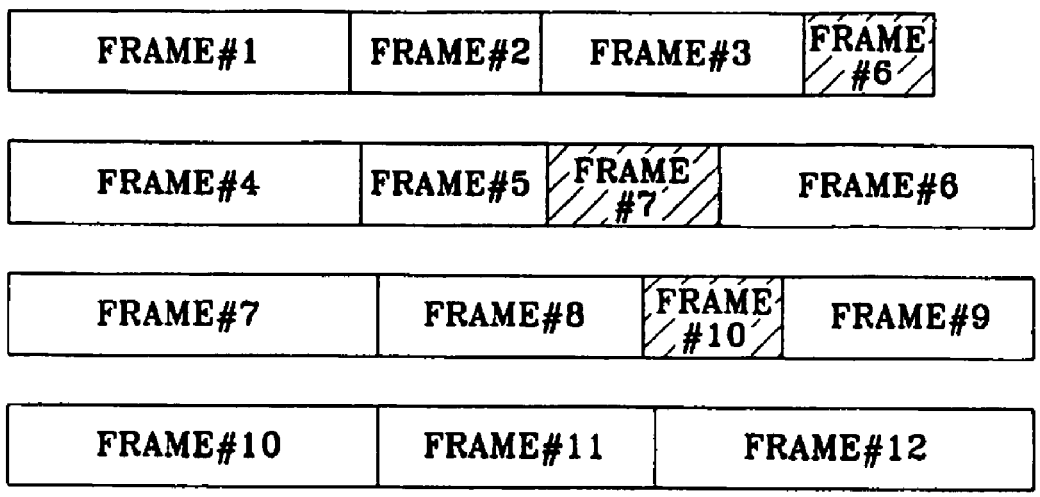
FIG. 3 shows a structure of a bitstream output from an output buffer shown in FIG. 1.

In this embodiment of the present invention, the bitrate controller 17 selects a particular frame temporally preceding the frame of the fourth data, and controls the output buffer 15 in such a manner that the fourth data is output together with the second data of the selected (other) frame. In this case, the bitrate controller 17 selects a preceding frame in which to add the fourth data based on the bitrate corresponding to a number of frames preceding the frame of the fourth data. In response to the control of the bitrate controller 17, the output buffer 15 outputs the second data, both the second and fourth data, or the third data in the form of a bitstream, in correspondence to a respective frame of the encoded audio data supplied from the lossless compression unit 13. Thus, in the case of the frames having the numbers shown in FIG. 2, the output buffer 15 outputs a bitstream as shown in FIG. 3, wherein the bitstream may be recorded on a recording medium such as a DVD. In FIG. 3, the frames which are not hatched are frames output from the output buffer 15 in the same sequence as that input to the output buffer 15 from the lossless compression unit 13, and the hatched portions show the fourth data added to the second data of a frame temporally preceding the original frame.

Figure 4:
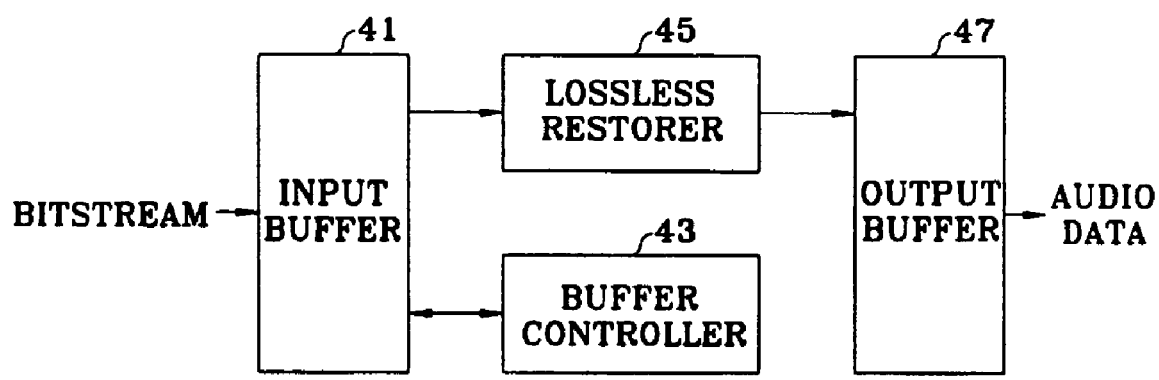
FIG. 4 is a block diagram showing a lossless decoding apparatus corresponding to the lossless encoding apparatus shown in FIG. 1.

FIG. 4 is a block diagram showing a lossless decoding apparatus for restoring the bitstream output from the lossless encoding apparatus shown in FIG. 1 and perhaps stored on a recording medium such as a DVD. In FIG. 4, an input buffer 41 stores bitstream data generated in the encoding apparatus of FIG. 1 in the same sequence as its input sequence. A buffer controller 43 controls the input buffer 41 in order to output the data stored in the input buffer 41 to a lossless restorer 45. Under the control of the buffer controller 43, the second data is output to the lossless restorer 45 without change, and the fourth data is combined with the third data corresponding to the fourth data, based on identification information added to the third data and the fourth data. The combined first data is output to the lossless restorer 45. Here, the buffer controller 43 determines the sequence of the first data and the second data both output to the lossless restorer 45 based on the second data and the third data. Thus, in the case that the second data precedes the third data among the data of the bitstream input to the input buffer 41, the second data is output to the lossless restorer 45 and then the first data corresponding to the third data is output to the lossless restorer 45. As a result, the input buffer 41 can supply the stored data to the lossless restorer 45 so that the lossless restorer 45 can restore data without any delay.

The lossless restorer 45 performs a reverse process of a signal processing in the above-described lossless compression unit 13 in order to restore the digital audio data, and outputs the restored audio data to an output buffer 47. The output buffer 47 stores the digital audio data supplied from the lossless restorer 45 and supplies the stored digital audio data to a following device (not shown).

Since it is apparent to those who are skilled in the art that the above lossless encoding apparatus and the above lossless decoding apparatus can be employed in a lossless encoding and decoding system, although it has not been shown in the drawings and described in the specification, a detailed description of such a lossless encoding and decoding system is omitted here.

As described above, the lossless encoding and decoding system including the lossless encoding apparatus and the lossless decoding apparatus controls the bitrate of the encoded audio data so that the encoded audio data can be decoded on a real-time basis. Thus, the present invention can be used in a real-time system with limited bitrate as in a disc playback device or a communications channel.

Although a preferred embodiment of the present invention has been shown and described, it would be appreciated by those skilled in the art that changes may be made in this embodiment without departing from the principles and spirit of the invention, the scope of which is defined in the claims and their equivalents.

What is claimed is:

1. A playback device including a lossless processing apparatus for processing encoded input audio data stored on a recording medium, comprising:
    a lossless restorer to decode and restore the encoded input audio data received in data units;
    an input controller to input the encoded input audio data output to the lossless restorer on a real-time basis, said input controller selects data from a first one of the data units that has been combined with the first data unit, where the first data unit is within a predetermined limit, and moves the selected data to a second one of the data units temporally following the first data unit such that the combined selected data and the second data are above the predetermined limit; and
    a playback unit which reproduces the restored audio data.

2. The playback device of claim 1, further comprising:
    an input buffer to store the encoded input audio data received from the recording medium and maintain an input sequence thereof; and
    an output buffer to store the restored audio data generated in the lossless restorer and to output the stored audio data to be reproduced by the playback device,
    wherein
        the selected data and the second data unit have the same identification information,
        the lossless restorer losslessly restores the encoded input audio data output from the input buffer, to generate the restored audio data,
        the input controller controls the input buffer so that one of the data units having no identification information among the encoded input audio data stored in the input buffer is supplied to the lossless restorer and the selected data having the identification information is combined with the second data unit having the same identification information and is supplied to the lossless restorer,
        the one data unit without the identification information has a data amount by which a result obtained by lossless encoding of the input audio data of a predetermined data unit does not exceed a maximum bitrate,
        the selected data and the second data unit having the same identification information form third data by which a result obtained by lossless encoding of the input audio data of a same predetermined data unit that exceeds the maximum bitrate, and
        the second data unit is encoded audio data having a data amount of the maximum bitrate among the third data and the selected data is encoded audio data of the portion exceeding the maximum bitrate among the third data.

3. The playback device of claim 1, wherein
    the encoded input audio data comprises audio data which has been losslessly compression encoded in sequence on a recording medium,
    the predetermined limit comprises a maximum bitrate,
    the selected data comprises an excessive data amount that has been combined with the first data unit which has less than the maximum bitrate,
    the input controller moves the excessive data amount of the selected data back to the corresponding second data unit originally having the selected data which forms an original data unit in excess of the maximum bitrate; and
    the lossless restorer losslessly restores the encoded audio data subsequent to the moving of the selected data back to the corresponding second data unit.

4. A method of playing back and processing encoded input audio data in real time, comprising:
    receiving from a storage medium the encoded input audio data and moving portions of the encoded input audio data between data amounts into which the encoded input audio data were encoded in sequence to achieve a constant bit rate;
    decoding and losslessly restoring the encoded input audio data;
    outputting the restored input audio data on a real-time basis; and
    reproducing the output audio data.

5. The method of claim 4, wherein:
the receiving comprises receiving a bitstream from the storage medium, the bitstream having been produced by
losslessly compression encoding the audio data in units of predetermined data and outputting the encoded audio data in sequence, and
distinguishing each predetermined data unit of the encoded audio data as first data having a data amount exceeding a maximum bitrate or second data having a data amount less than the maximum bitrate, dividing the first data into third data being the encoded audio data having a data amount of the maximum bitrate and fourth data being the encoded audio data of a portion of the first data exceeding the maximum bitrate, adding identification information to the third data and fourth data to indicate which of the third data and fourth data are from the same predetermined data units, and controlling the encoded audio data so that the fourth data is output together with the second data, and the second through fourth data are output as a bitstream, and
the decoding and losslessly restoring comprises losslessly restoring the bitstream, to generate the input audio data, such that the second data having no identification information among the bitstream is losslessly restored and the third data and fourth data having the same identification information are combined and losslessly restored.

6. The method of claim 4, wherein the moving the portions comprises controlling the lossless restoring so that first data having no identification information among the input audio data is losslessly restored and second data having identification information is combined with third data having the same identification information and is losslessly restored, wherein the first data has a data amount by which a result obtained by lossless encoding of the input audio data of a predetermined data unit does not exceed a maximum bitrate, and the second data and third data form fourth data by which a result obtained by lossless encoding of the input audio data of a same predetermined data unit exceeds the maximum bitrate, and wherein the second data is encoded audio data having a data amount of the maximum bitrate among the fourth data and the third data is encoded audio data of the portion exceeding the maximum bitrate among the fourth data.

7. The method of claim 4, wherein the moving the portions comprises
buffering the portions to be moved in a buffer, and
combining the buffered portions with the corresponding ones of the data amounts originally having the portions.

8. The method of claim 4, wherein the moving the portions comprises
buffering a first portion of a first data amount, the first portion comprising encoded audio data added to a first original data amount to create the first data amount, and
combining the buffered first portion with a second data amount to create a second original data amount, where the first portion was moved during encoding from the second original data amount which exceeded a predetermined size to create the second data amount which is within the predetermined size.

9. The method of claim 4, wherein:
the moving the portions comprises
buffering a first portion of a first data amount, the first portion comprising audio data added to a first original data amount to create the first data amount, and
combining the buffered first portion with a second data amount to create a second original data amount, where the first portion was moved from the second original data amount to create the second data amount, and
the reproducing comprises reproducing the first and second original data amounts in the sequence.

* * * * *